US007535789B1

(12) United States Patent
Fischaber et al.

(10) Patent No.: US 7,535,789 B1
(45) Date of Patent: May 19, 2009

(54) CIRCUITS AND METHODS OF CONCATENATING FIFOS

(75) Inventors: Thomas E. Fischaber, Golden, CO (US); James M. Simkins, Park City, UT (US); Peter H. Alfke, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 153 days.

(21) Appl. No.: 11/528,117

(22) Filed: Sep. 27, 2006

(51) Int. Cl.
*G11C 8/00* (2006.01)

(52) U.S. Cl. ............... 365/230.05; 710/57; 326/46

(58) Field of Classification Search ............ 326/37–41, 326/47; 365/189.01, 220–221, 230.03, 230.05, 365/233; 710/52, 57
See application file for complete search history.

(56) References Cited

U.S. PATENT DOCUMENTS

| | | | | |
|---|---|---|---|---|
| 5,615,355 | A * | 3/1997 | Wagner | 711/167 |
| 5,956,492 | A * | 9/1999 | Jander et al. | 710/106 |
| 6,191,992 | B1 * | 2/2001 | Komoto | 365/221 |
| 6,208,703 | B1 * | 3/2001 | Cavanna et al. | 375/375 |
| 6,400,642 | B1 * | 6/2002 | Mehrotra et al. | 365/233.19 |
| 6,434,642 | B1 * | 8/2002 | Camilleri et al. | 710/57 |
| 7,106,098 | B1 * | 9/2006 | Zack et al. | 326/40 |
| 7,191,162 | B2 * | 3/2007 | Gibbs et al. | 706/16 |
| 7,209,983 | B2 * | 4/2007 | Au et al. | 710/52 |
| 7,227,380 | B2 * | 6/2007 | Elftmann et al. | 326/40 |
| 2002/0075980 | A1 | 6/2002 | Tang et al. | |
| 2002/0080672 | A1 | 6/2002 | Lee et al. | |
| 2002/0138674 | A1 | 9/2002 | Mann | |

OTHER PUBLICATIONS

Xilinx, Inc.; "Virtex-4 User Guide"; UG070 (v1.5); Chapter 4; Mar. 21, 2006; available from www.xilinx.com; pp. 109-161.
Lois Cartier; "Implementing FIFOs in XC4000 Series RAM"; XAPP 053; (Version 1.1); Jul. 7, 1996; available from www.xilinx.com/ pp. 1-16.
Peter Alfke; "Synchronous and Asynchronous FIFO Designs"; XAPP 051; (Version 2.0); Sep. 17, 1996; available from www.xilinx.com; pp. 1-12.

(Continued)

*Primary Examiner*—James H. Cho
*Assistant Examiner*—Christopher Lo
(74) *Attorney, Agent, or Firm*—LeRoy D. Maunu

(57) ABSTRACT

Circuits and methods of concatenating first-in-first-out memory circuits (FIFOs). A concatenated FIFO includes first and second FIFOs. The data output terminals of the first FIFO are coupled to the data input terminals of the second FIFO. The read clock of the second FIFO is the system read clock, and the write clock of the first FIFO is the system write clock. Communication between the first and second FIFOs is controlled by the faster of the two system clocks. A control circuit coupled to both the first and second FIFOs has a local clock input terminal coupled to the read clock input terminal of the first FIFO and the write clock input terminal of the second FIFO. The control circuit is driven by status signals from the first and second FIFOs, and generates a read enable signal for the first FIFO and a write enable signal for the second FIFO.

12 Claims, 6 Drawing Sheets

OTHER PUBLICATIONS

Xilinx, Inc.; "170 MHz FIFOs Using the Virtex Block SelectRAM+ Feature"; XAPP 131; (Version 1.7); Mar. 26, 2003; available from www.xilinx.com; pp. 1-7.

Xilinx, Inc.; "High Speed FIFOs in Spartan-II FPGAs"; XAPP 175; (Version 1.0); Nov. 23, 1999; available from www.xilinx.com; pp. 1-6.

Nick Camilleri; "Data-Width Conversion FIFOs Using the Virtex Block SelectRAM Memory"; XAPP 205; (Version 1.3); Aug. 10, 2000; available from www.xilinx.com; pp. 1-6.

Xilinx, Inc.; "FIFOs Using Virtex-II Block RAM"; XAPP 258; (Version 1.4); Jan. 7, 2005; available from www.xilinx.com; pp. 1-6.

Nick Camilleri; "Data-Width Conversion FIFOs Using the Virtex Block RAM Memory"; XAPP 261; (Version 1.0); Jan. 10, 2001; available from www.xilinx.com; pp. 1-6.

Marc Defossez, Nick Sawyer; "Using Block SelectRAM Memories as Serializers or Deserializers"; XAPP 690; (Version 1.0); Oct. 6, 2003; available from www.xilinx.com; pp. 1-13.

Wen Ying Wei, Dai Huang; "Parameterizable LocalLink FIFO"; XAPP 691; (Version 1.0); Feb. 2, 2004; available from www.xilinx.com; pp. 1-30.

Xilinx, Inc.; "FIFO Generator v2.0"; Product Specification; Nov. 11, 2004; available from www.xilinx.com; pp. 5-61.

Xilinx, Inc.; "FIFO Generator v1.0"; Product Specification; DS478; Apr. 23, 2004; available from www.xilinx.com; pp. 1-45.

Xilinx, Inc.; "FIFO Generator v1.1"; Product Specification; DS296; May 21, 2004; available from www.xilinx.com; pp. 1-51.

Xilinx, Inc.; "Answer Record # 22462: Virtex-4—Why are the FIFO16 flags not working correctly?"; last modified May 8, 2006; downloaded Jul. 6, 2006 from http://www.xilinx.com/xlnx/xil_ans_display.jsp?iLanguageID=1&iCountryID=1&getPageP...; pp. 1-6.

Xilinx, Inc.; "Ayncrhonous FIFO v5.0"; Product Specification; DS232(v0.1); Nov. 1, 2002; available from www.xilinx.com; pp. 1-9.

Xilinx, Inc.; "Ayncrhonous FIFO v5.1"; Product Specification; DS232(v0.2); Mar. 28, 2003; available from ww.xilinx.com; pp. 1-9.

Xilinx, Inc.; "Ayncrhonous FIFO v6.0"; Product Specification; DS232; Nov. 11, 2004; available from www.xilinx.com; pp. 1-12.

Xilinx, Inc.; "Ayncrhonous FIFO v6.1"; Product Specification; DS232; Nov. 11, 2004; available from www.xilinx.com; pp. 1-12.

Xilinx, Inc.; "Synchronous FIFO v4.0"; Product Specification; DS256(v1.0); Mar. 28, 2003; available from ww.xilinx.com; pp. 1-6.

Xilinx, Inc.; "Synchronous FIFO v5.0"; Product Specification; DS256; May 21, 2004; available from ww.xilinx.com; pp. 1-10.

Paul Gigliotti; "Serial-to-Parallel Converter"; XAPP 194; (Version 1.0); Jul. 20, 2004; available from www.xilinx.com; pp. 1-6.

\* cited by examiner

US 7,535,789 B1

CIRCUITS AND METHODS OF CONCATENATING FIFOS

FIELD OF THE INVENTION

The invention relates to first-in-first-out memory circuits (FIFOs). More particularly, the invention relates to circuits and methods of concatenating FIFOs in an integrated circuit.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell. The terms "PLD", "programmable logic device", and "programmable integrated circuit" include but are not limited to these exemplary devices, as well as encompassing devices that are only partially programmable. For example, one type of programmable IC includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory (RAM) blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

As noted above, one of the dedicated logic elements that can be included in an FPGA or other programmable IC is a BRAM, or block RAM. In some programmable ICs, the block RAM can be configured as a first-in-first-out memory circuit (FIFO). A block RAM can typically be configured to have any of several predetermined aspect ratios. For example, an 18K block RAM in the Virtex-4™ FPGA from Xilinx, Inc. can be configured to implement a FIFO 512, 1024, 2048, or 4096 words deep. However, because the block RAM has a fixed size (e.g., 18K bits), there will always be a maximum size for a FIFO implemented using the block RAM.

In order to increase the size of a FIFO over and above the predetermined maximum, it is common to concatenate ("chain together") multiple FIFOs. Concatenated FIFO 200 of FIG. 2 demonstrates one way in which two FIFOs can be concatenated to produce a FIFO having twice the depth of a single FIFO, e.g., a FIFO that can be implemented using only one block RAM.

In FIG. 2, both FIFOs 201, 202 operate with free-running clocks. Operation of the concatenated FIFO is controlled through write enable (WEN) and read enable (REN) signals, which drive the WREN and RDEN input terminals of both FIFOs 201, 202. The free-running system write clock signal WCLK and the free-running system read clock signal RCLK are used to clock the leftmost FIFO (input terminals WRCLK and RDCLK of FIFO 201), while all downstream FIFOs (202 and any additional concatenated FIFOs, not shown) use the system read clock RCLK as both read clock and write clock signals. The empty (EMPTY), almost empty (AEMPTY), full (FULL), and almost full (AFULL) output signals are well known status signals commonly provided by FIFOs. (Note that in the present specification, the same reference characters are used to refer to terminals, signal lines, and their corresponding signals.)

The input data flows from the leftmost FIFO 201 downstream to FIFO 202, e.g., from circuit input terminals DI<3:0>, to input terminals DIN<3:0> of FIFO 201, from output terminals DOUT<3:0> of FIFO 201 to input terminals DIN<3:0> of FIFO 202, and finally from output terminals DOUT<3:0> of FIFO 202 to circuit output terminals DO<3:0>. Note that in the pictured example, two 4K×4 FIFOs (201, 202) are concatenated. Therefore, the input and output data busses are 4-bit busses. However, these data widths are purely exemplary, and it is well known that this concatenation method can be applied equally well to FIFOs of other sizes. Further, it will be clear to those of skill in the art that more than two FIFOs can be concatenated using this method, by adding one or more additional FIFOs after the rightmost FIFO 202. An additional NOR gate is needed between the EMPTY output terminal of each upstream FIFO and the WREN input terminal of each succeeding FIFO in the chain, and feeding back to the RDEN input terminal of the preceding FIFO in the chain. The REN signal always drives the RDEN input terminal of the last FIFO in the chain.

The concatenated FIFO of FIG. 2 includes two FIFOs 201, 202 implemented using block RAM in an exemplary PLD. The two FIFOs are connected using a NOR gate 203, which is implemented using logic in the programmable logic fabric of the PLD. NOR gate 203 ensures that no data is written to the second FIFO 202 when either the first FIFO is empty (signal EMPTY from FIFO 201 is high, signaling that no valid data is available from FIFO 201) or the second FIFO is full (signal FULL from FIFO 202 is high, signaling that there is no more room in the second FIFO).

Routing the feedback path from the FULL output terminal of FIFO 202 through the programmable logic, and then to the RDEN input terminal of FIFO 201 and the WREN input terminal of FIFO 202, can have a significant delay. In practice, it has been found that this feedback path can limit the operating frequency of the entire concatenated FIFO. Therefore, it is desirable to provide circuits and methods of concatenating FIFOs in which the maximum clock frequency is not adversely affected by the concatenation.

Additionally, in order for the concatenated FIFO of FIG. 2 to function properly, the leftmost FIFO 201 must be designed or programmed to operate in a first-word-fall-through (FWFT) mode. A FIFO in FWFT mode provides valid read output data (e.g., at output terminal DOUT<3:0> for the FIFOs in FIG. 2) without the need for performing a read cycle from the FIFO. In contrast, in standard mode the first word written to an empty FIFO does not appear on the data output lines until a specific read operation is performed. Not all FIFOs have the capability of operating in FWFT mode, because FWFT mode requires increases internal circuit complexity and resources. Therefore, it is further desirable to provide circuits and methods of concatenating FIFOs that do not require FWFT capability.

SUMMARY OF THE INVENTION

The invention provides circuits and methods of concatenating first-in-first-out memory circuits (FIFOs). The circuits and methods of the invention have the advantage of not requiring a first-word-fall-through (FWFT) mode for the FIFOs in the concatenation, although FWFT mode can be accommodated, if desired. Additionally, the circuits and methods of the invention have the further advantage of allowing for a faster operating frequency of the concatenated FIFO than is generally achieved using known circuits and methods.

According to one embodiment of the invention, a concatenated FIFO includes first and second FIFOs. The data output terminals of the first FIFO are coupled to the data input terminals of the second FIFO. The read clock of the second FIFO is the system read clock, and the write clock of the first FIFO is the system write clock. Communication between the first and second FIFOs is preferably controlled by the faster of the two system clocks. (In some embodiments, the system clock is inverted before being used to control communication between the two FIFOs.) A control circuit for the concatenated FIFO is coupled to both the first and second FIFOs, and has a local clock input terminal coupled to the read clock input terminal of the first FIFO and to the write clock input terminal of the second FIFO.

In some embodiments, the control circuit is driven by status signals from the first and second FIFOs (e.g., an empty or almost-empty signal from the first FIFO and a full or almost-full signal from the second FIFO). The control circuit generates from these status signals a read enable signal for the first FIFO and a write enable signal for the second FIFO. In some embodiments, the control circuit includes three flip-flops that register the read enable signal, the write enable signal, and an internal node of the control circuit. These flip-flops are clocked by the local clock signal, and provide the capability of "pipelining" the data in the concatenated FIFO, allowing the use of system clocks with a higher clock frequency that can be supported by known concatenated FIFOs.

The invention also encompasses a programmable integrated circuit (IC) in which the above-described concatenated FIFO can be implemented. For example, the first and second FIFOs can be implemented using either dedicated RAM blocks, lookup tables programmed to function as FIFOs, or one or more of each of these memories. The first FIFO operates in standard mode, while the second FIFO can be programmed to function in either first-word-fall-through (FWFT) mode or in standard mode. The invention further encompasses methods of programming a programmable IC to implement a concatenated FIFO as described above.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable ICs such as programmable logic devices (PLDs). An appreciation of the present invention is presented by way of specific examples utilizing PLDs such as field programmable gate arrays (FPGAs). However, the present invention is not limited by these examples.

Further, in the following description, numerous specific details are set forth to provide a more thorough understanding of the present invention. However, it will be apparent to one skilled in the art that the present invention can be practiced without these specific details.

Figure 3:
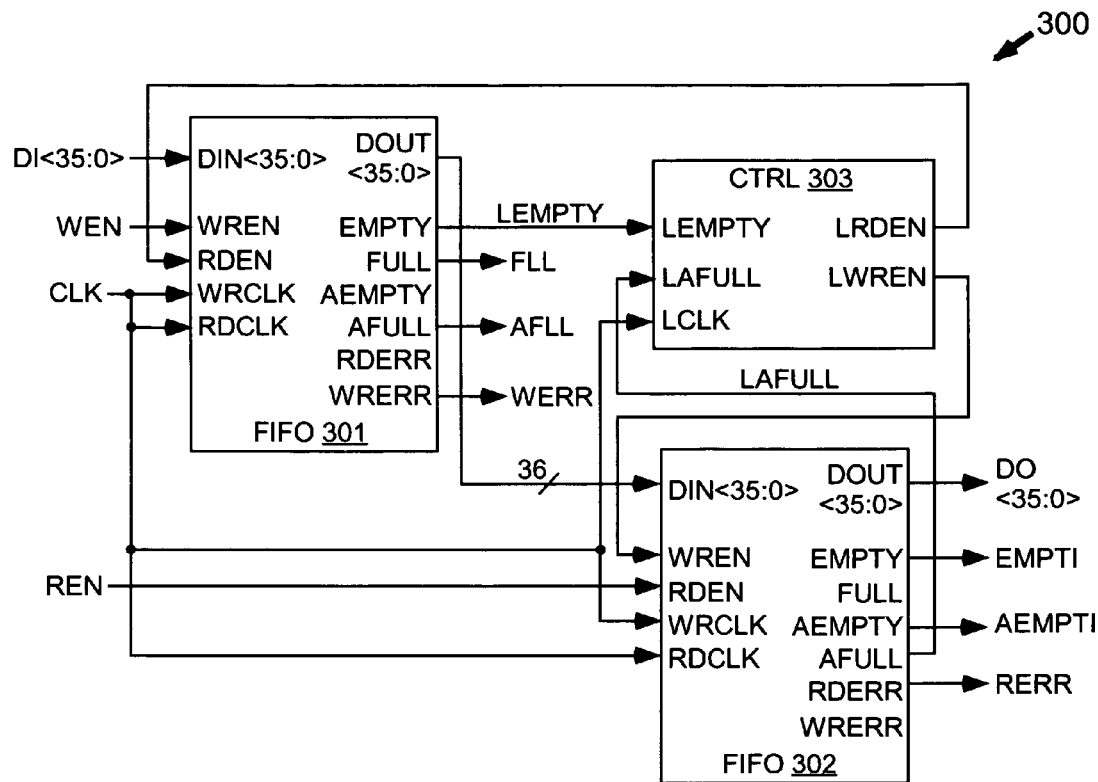
FIG. 3 illustrates a first concatenated FIFO according to a first embodiment of the present invention.
Figure 5:
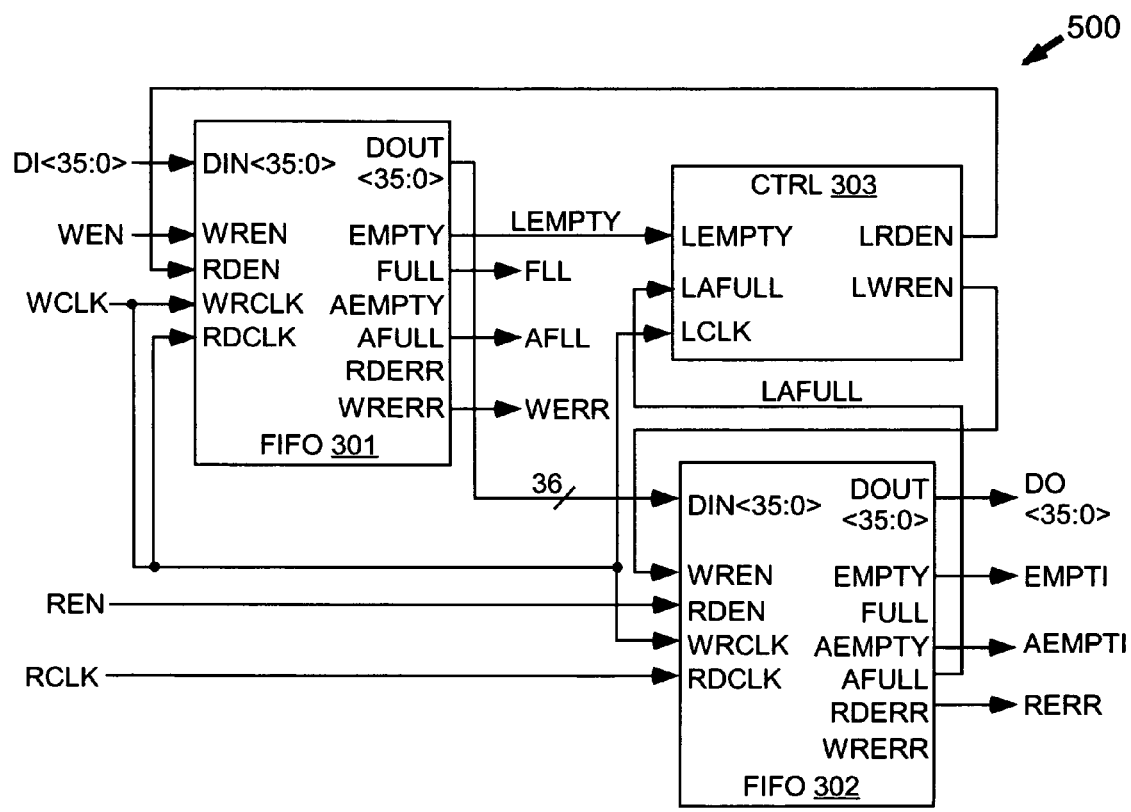
FIG. 5 illustrates a second concatenated FIFO according to a second embodiment of the present invention.
Figure 6:
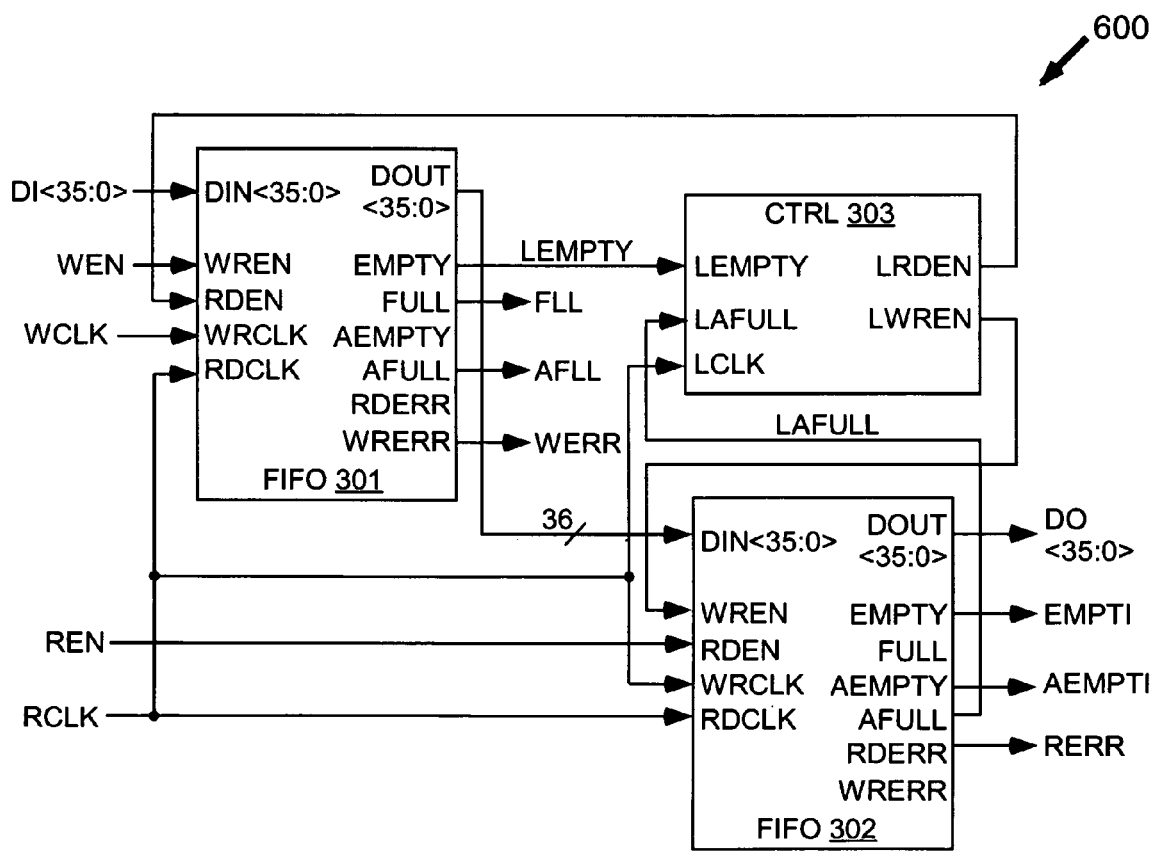
FIG. 6 illustrates a third concatenated FIFO according to a third embodiment of the present invention.

FIG. 3 illustrates a first concatenated FIFO according to a first embodiment of the present invention. The concatenated FIFO of FIG. 3 includes two smaller FIFOs 301, 302 that are synchronized with each other. In other words, the same clock signal CLK is used to clock both of FIFOs 301, 302, e.g., to perform both read and write functions for the concatenated FIFO. Asynchronous FIFOs, in which the read and write functions are controlled by two independent clocks, are also commonly used. FIGS. 5 and 6 illustrate exemplary asynchronous concatenated FIFOs, which are later described in conjunction with these figures.

Figure 1:
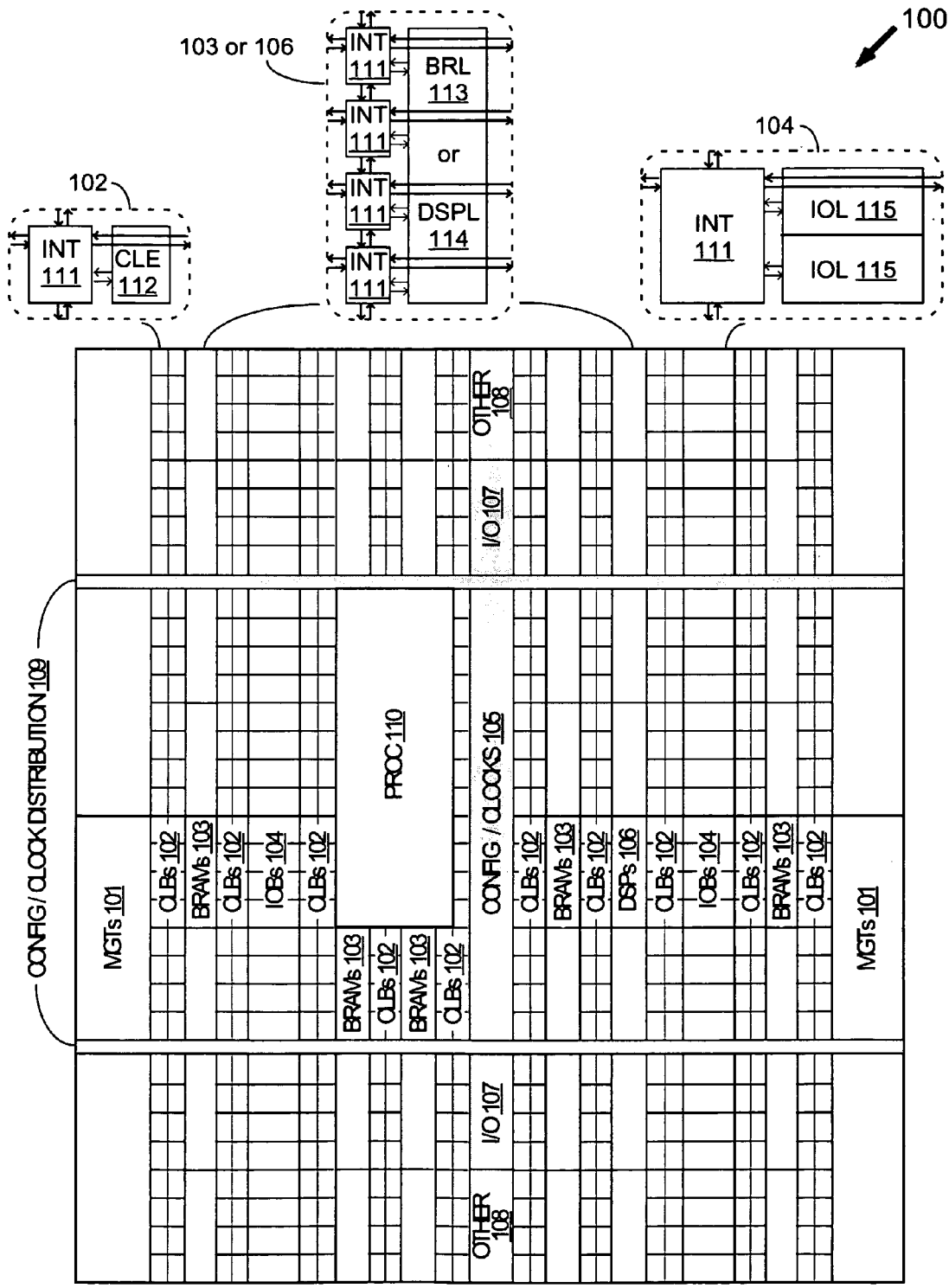
FIG. 1 illustrates a programmable logic device (PLD) that includes a variety of programmable logic blocks.

In the embodiment of FIG. 3, FIFOs 301, 302 are both block RAM (BRAM) blocks, e.g., similar to BRAM blocks 103 of FIG. 1. In other embodiments (not shown), one or both of FIFOs 301, 302 are replaced by a FIFO implemented using a programmable lookup table. It will be apparent to one skilled in the art after reading this specification that the present invention can be practiced within these and other architectural variations.

The write clock signals WRCLK and read clock signals RDCLK for FIFOs 301 and 302 are all clocked by the system clock CLK. In some embodiments (not shown), the RDCLK signal for FIFO 301 and the WRCLK signal for FIFO 302 are clocked by the inversion of the system clock CLK.

The communication between the two FIFOs 301, 302 is controlled by a control circuit 303 clocked by local clock signal LCLK. In the embodiment of FIG. 3, local clock signal LCLK is the same as clock signal CLK (inverted in some embodiments, not shown). Control circuit 303 is driven by the empty status signal EMPTY of FIFO 301 (local empty signal LEMPTY) and the almost-full status signal AFULL of FIFO 302 (local almost-full signal LAFULL). Control circuit 303 generates local read enable signal LRDEN, which provides a read enable signal RDEN for FIFO 301, and local write enable signal LWREN, which provides a write enable signal WREN for FIFO 302.

The concatenated FIFO of FIG. 3 functions as follows. New data is written to the concatenated FIFO via the DI<35:0> input terminals, so new data is written to FIFO 301 via the DIN<35:0> terminals of FIFO 301. The data is written when system clock signal CLK goes high and write enable signal WEN is active high. At the same time, provided that signal LEMPTY is low, data is read from FIFO 301 (e.g., from the DOUT<35:0> terminals of FIFO 301) and written to FIFO 302 (e.g., to the DIN<35:0> terminals of FIFO 302). Control circuit 303 prevents the transfer of data from FIFO 301 to FIFO 302 when FIFO 302 is full, and under certain other conditions as explained below. When system clock signal CLK goes high and read enable signal REN is active high, data is read from the concatenated FIFO via the DO<35:0> terminals, so data is read from FIFO 302 via the DOUT<35:0> terminals of FIFO 302.

If a first-word-fall-through (FWFT) option is available for FIFO 302, FIFO 302 can be placed in FWFT mode, so that data will appear at the data output terminals DO<35:0> without waiting for a read operation to occur. However, in some embodiments, FIFO 302 is operated in standard mode (i.e., not in FWFT mode). FIFO 301 operates in standard mode.

The system full status signal FLL is provided by the FULL status signal from the first FIFO 301, and the almost-full status signal AFLL for the system is provided by the AFULL status signal from the first FIFO 301. The system empty status signal EMPTI is provided by the EMPTY status signal from the second FIFO 302, and the almost-empty status signal AEMPTI for the system is provided by the AEMPTY status signal from the second FIFO 302. A system write error indicator WERR is provided by the write error signal WRERR from the first FIFO 301, while a system read error indicator RERR is provided by the read error signal RDERR from the second FIFO 302.

In the embodiments of FIGS. 3, 5, and 6, the input and output data busses are 36-bit busses. However, these data widths are purely exemplary, and the circuits and methods of the invention can be applied equally well to FIFOs of other sizes. Further, it will be clear to those of skill in the art that more than two FIFOs can be concatenated, by adding one or more additional FIFOs to the circuit in each figure. The read enable signal REN is always provided to the read enable input terminal RDEN of the last FIFO in the concatenated chain. Another control circuit (e.g., similar to control circuit 303) is inserted between each new pair of consecutive FIFOs. All of the FIFOs except the last FIFO are placed in standard mode, while the last FIFO can be in either standard mode or FWFT mode. Status signals EMPTI, AEMPTI, and RERR are provided by the last FIFO in the chain.

Figure 4:
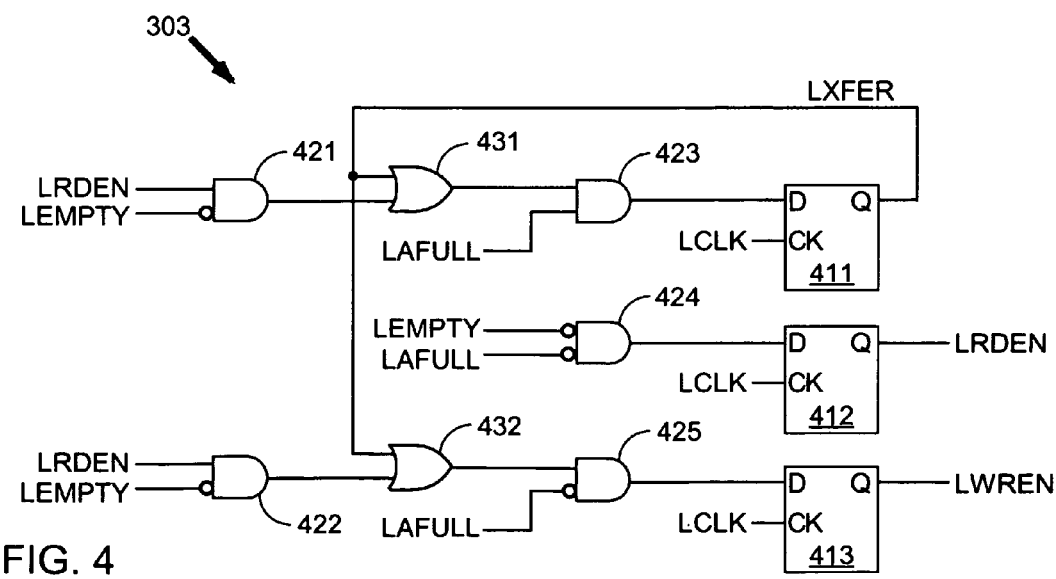
FIG. 4 illustrates an exemplary control circuit that can be used, for example, with the concatenated FIFO of FIG. 3.

FIG. 4 illustrates one embodiment of control circuit 303 that can be used, for example, with the concatenated FIFO of FIG. 3. Control circuit 303 includes AND gates 421-425, OR gates 431-432, and flip-flops 411-413, coupled together as shown in FIG. 4. A "bubble" (a small open circle) on the input terminal of a logic gate indicates that the signal is inverted at the logic gate.

Note that signals LXFER (a local transfer flag signal), LRDEN (the local read enable signal), and LWREN (the local write enable signal) are registered using flip-flops 411-413, respectively, which are clocked by the local clock signal LCLK. The registering of these three signals permits, in effect, the pipelining of data and control signals between the FIFOs. This extra control pipeline stage typically permits the concatenated FIFO to operate at a higher clock rate than well known FIFOs such as the concatenated FIFO of FIG. 2. Therefore, although control circuit 303 includes much more logic than the NOR gate 203 shown in FIG. 2, for example, the operating frequency of the concatenated FIFO is not adversely affected by this additional logic, because the new logic is registered.

Note also that it is not a straightforward matter to provide pipelining in a concatenated FIFO. For example, referring now to FIG. 2, if a flip-flop were inserted after NOR gate 203 the circuit would not function properly. When the EMPTY signal of FIFO 201 went high, the write enable signal WREN of FIFO 202 would not go low (i.e., writing to FIFO 202 would not be disabled) until one clock cycle later, and false data would be passed from FIFO 201 to FIFO 202 at the next active edge of the RCLK signal. Similarly, when the FULL signal of FIFO 202 went high, the write enable signal WREN of FIFO 202 would not be disabled until one clock cycle later, and new data would be written to the already-full FIFO 202 at the next active edge of the RCLK signal.

These difficulties presented by the known implementation of a concatenated FIFO can be overcome, for example, by implementing control circuit 303 as shown in FIG. 4.

Control circuit 303 of FIG. 4 functions as follows. Data can be read from the upstream FIFO 301 (local read enable signal LRDEN is high) and written to the downstream FIFO 302 (local write enable signal LWREN is high) when the upstream FIFO (FIFO 301) is not almost empty (LEMPTY is low) and the downstream FIFO (FIFO 302) is not full (LAFULL is low). Writing to the downstream FIFO 302 is also enabled (local write enable signal LWREN is high) when a read operation is performed on the downstream FIFO 302, i.e., when LRDEN is high and LEMPTY is low. Signal LXFER is a local transfer flag signal indicating that there is a word ready on the data output pins of FIFO 301 to transfer to FIFO 302, but FIFO 302 is full. Thus, flip-flop 411 stores a write request for FIFO 302. This write request can be generated when a read from FIFO 301 is performed on a given cycle of the local clock signal, and FIFO 302 reports that it is almost full (signal LAFULL goes high).

In the pictured embodiment, an artifact of cascading FIFOs as shown in FIGS. 3-4 is that the depth of the FIFO will vary by up to three words, depending on the state of the local control signals. However, this artifact should not cause any problems with traditional FIFO designs.

Figure 2:
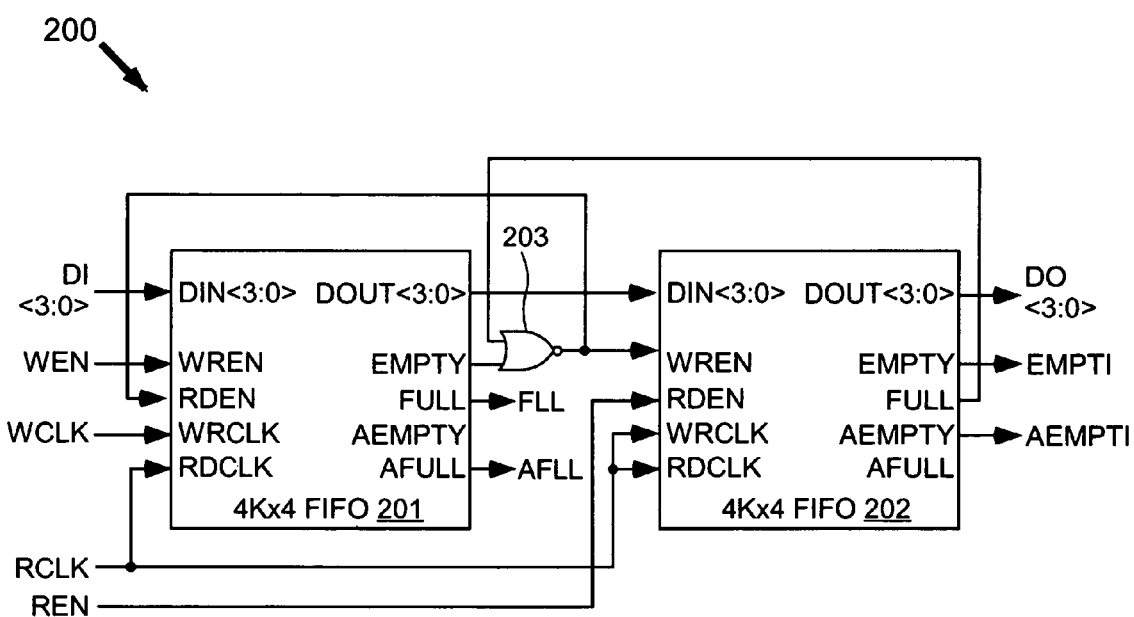
FIG. 2 illustrates a known implementation of a concatenated FIFO.

Because of the pipelined intra-FIFO communication logic, the concatenated FIFO can be operated at about the same operating frequency as the individual FIFOs. For example, in one embodiment the FIFO block used in FIG. 3 has relatively slow clock-to-out and setup times. When the concatenated FIFO is implemented as shown in FIG. 2, the sum of these two parameters is the limiting factor for the operating frequency of the concatenated FIFO. For example, in one PLD having dedicated RAM blocks configurable as FIFOs 201, 202, the maximum operating frequency is limited by the sum of the clock-to-out and setup times, and is about 350 MHz (megahertz). When the concatenated FIFO is implemented as shown in FIGS. 3-4, these two parameters are separated, and the operating frequency of the concatenated FIFO is limited by the operating frequency of the dedicated RAM blocks, e.g., the concatenated FIFO can operate at more than 500 MHz.

The embodiment of FIG. 3 assumes that the two FIFOs are synchronous. In some designs, it may be desirable to concatenate two FIFOs controlled by two different clock signals. FIGS. 5 and 6 illustrate two such embodiments. When the two FIFOs are controlled by different clock signals, the faster of the two clocks should be used to communicate between the two FIFOs, in order to avoid bottlenecks. FIG. 5 illustrates a concatenated FIFO in which the write clock is faster than the read clock. FIG. 6 illustrates a concatenated FIFO in which the read clock is faster than the write clock.

FIG. 5 illustrates a second concatenated FIFO according to a second embodiment of the present invention, in which the system write clock is faster than the system read clock. The concatenated FIFO of FIG. 5 includes two smaller FIFOs 301, 302. The write clock signal WRCLK of the first FIFO 301 is provided by the system write clock signal WCLK. The read clock signal RDCLK of the second FIFO 302 is provided by the system read clock signal RCLK. Because the system write clock is faster than the system read clock, the system write clock WCLK is provided as the local clock signal. The local clock signal controls the communications between the two FIFOs 301, 302 by driving the control circuit 303, the read clock signal RDCLK of the first FIFO 301, and the write clock signal WRCLK of the second FIFO 302. FIFOs 301, 302 and control circuit 303 can be similar to similarly numbered elements in FIG. 3, for example.

FIG. 6 illustrates a third concatenated FIFO according to a third embodiment of the present invention, in which the system read clock is faster than the system write clock. The concatenated FIFO of FIG. 6 includes two smaller FIFOs 301, 302. The write clock signal WRCLK of the first FIFO 301 is provided by the system write clock signal WCLK. The read clock signal RDCLK of the second FIFO 302 is provided by the system read clock signal RCLK. Because the system read clock is faster than the system write clock, the system read clock RCLK is provided as the local clock signal. The local clock signal controls the communications between the two FIFOs 301, 302 by driving the control circuit 303, the read clock signal RDCLK of the first FIFO, and the write clock signal WRCLK of the second FIFO 302. FIFOs 301, 302 and control circuit 303 can be similar to similarly numbered elements in FIG. 3, for example.

Figure 7:
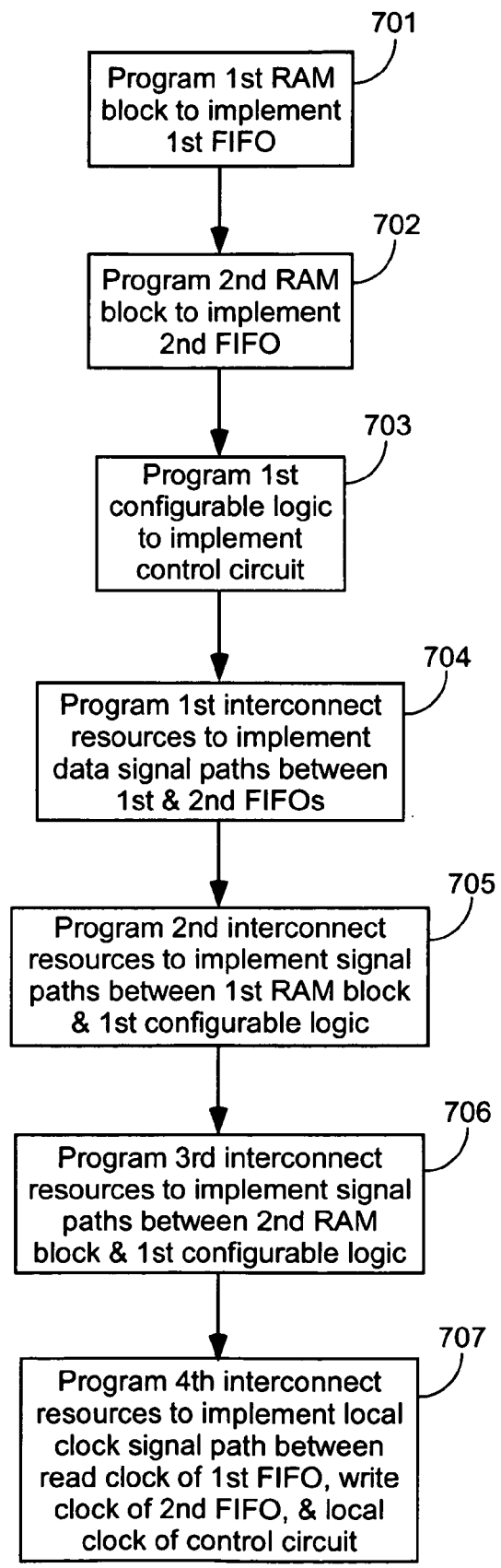
FIG. 7 illustrates the steps of a method of implementing a concatenated FIFO in accordance with another aspect of the present invention.

FIG. 7 illustrates the steps of an exemplary method of implementing a concatenated FIFO in a programmable IC, in accordance with another aspect of the present invention. The illustrated steps can be used, for example, to implement any of the concatenated FIFOs of FIGS. 3, 5, and 6 in a programmable IC.

In step 701, a first RAM block is programmed to implement a first FIFO. The first RAM block can be, for example, a dedicated memory block (as in FIGS. 3 and 5) or a lookup table that can be programmed to function as a FIFO (as in FIG. 6). In step 702, a second RAM block is programmed to implement a second FIFO. The second RAM block can be, for example, a dedicated memory block (as in FIGS. 3 and 6) or a lookup table that can be programmed to function as a FIFO (as in FIG. 5). If desired, the second RAM block can be programmed to operate in first-word-fall-through (FWFT) mode, while the first RAM block is programmed to operate in standard mode. In other embodiments, both RAM blocks are programmed to operate as FIFOs in standard mode.

In step 703, configurable logic in the programmable IC is programmed to implement a control circuit for the concatenated FIFO.

In step 704, interconnect resources of the programmable IC are programmed to implement data signal paths between the first and second FIFOs. For example, these signal paths can correspond to the signal paths between the DOUT terminals of the first FIFO and the DIN terminals of the second FIFO, as shown in FIGS. 3, 5, and 6. These signal paths can be implemented, for example, using general interconnect resources in a programmable interconnect structure of the programmable IC.

In step 705, interconnect resources of the programmable IC are programmed to implement signals paths between the first RAM block and the first configurable logic, e.g., between the first FIFO and the control circuit. These signal paths might be, for example, the LEMPTY and read enable signal paths illustrated in FIGS. 3, 5, and 6. These signal paths can be implemented, for example, using general interconnect resources in a programmable interconnect structure of the programmable IC.

In step 706, interconnect resources of the programmable IC are programmed to implement signals paths between the second RAM block and the first configurable logic, e.g., between the second FIFO and the control circuit. These signal paths might be, for example, the LAFULL and write enable signal paths illustrated in FIGS. 3, 5, and 6. These signal paths can be implemented, for example, using general interconnect resources in a programmable interconnect structure of the programmable IC.

In step 707, interconnect resources of the programmable IC are programmed to implement a local clock signal path between the read clock of the first FIFO, the write clock of the second FIFO, and the local clock of the control circuit. This signal path might be, for example, the LCLK signal path illustrated in FIGS. 3, 5, and 6. This signal path can be implemented, for example, using general interconnect resources in a programmable interconnect structure of the programmable IC, or using resources included in a clock distribution network of the programmable IC.

Note that steps 701-707 need not be performed in the order shown in FIG. 7. For example, the various programming steps can be performed concurrently, or in some other order. In some embodiments, steps 701-707 are performed as part of a single programming operation that loads a user design in to the programmable IC.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the circuits of the invention in the context of programmable integrated circuits (ICs) such as programmable logic devices (PLDs). However, the circuits of the invention can also be implemented in other integrated circuits, including non-programmable circuits. The circuits of the invention can also be implemented in other electronic systems, for example, in printed circuit boards including discrete devices.

Further, programmable ICs, PLDs, RAM blocks, FIFOs, lookup tables, control circuits, inverting circuits, inverters, OR gates, NOR gates, AND gates, NAND gates, flip-flops, FIFOs, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A concatenated first-in-first-out memory circuit (FIFO), comprising:
    a first FIFO having a plurality of data input terminals, a plurality of data output terminals, a write clock input terminal coupled to receive a write clock signal for the concatenated FIFO, and a read clock input terminal;
    a second FIFO having a plurality of data input terminals coupled to the data output terminals of the first FIFO, a plurality of data output terminals, a write clock input terminal, and a read clock input terminal coupled to receive a read clock signal for the concatenated FIFO; and
    a control circuit coupled to the first FIFO and to the second FIFO, the control circuit having a local clock input terminal coupled to the read clock input terminal of the first FIFO and to the write clock input terminal of the second FIFO,
    wherein the local clock input terminal of the control circuit, the read clock input terminal of the first FIFO, and the write clock input terminal of the second FIFO are all coupled to receive one of the read clock signal or write clock signal for the concatenated FIFO.

2. The concatenated FIFO of claim 1, wherein the local clock input terminal of the control circuit is coupled to receive a local clock signal having a clock frequency at least equal to a clock frequency of the write clock signal and at least equal to a clock frequency of the read clock signal.

3. The concatenated FIFO of claim 1, wherein:
    the first FIFO comprises a first status output terminal coupled to a first input terminal of the control circuit;
    the second FIFO comprises a second status output terminal coupled to a second input terminal of the control circuit;
    the control circuit comprises a read enable output terminal coupled to a read enable input terminal of the first FIFO; and
    the control circuit further comprises a write enable output terminal coupled to a write enable input terminal of the second FIFO.

4. The concatenated FIFO of claim 3, wherein the control circuit comprises:
    first logic having input terminals coupled to the first input terminal of the control circuit, the second input terminal of the control circuit, the read enable output terminal of the control circuit, and an internal node, the first logic having an output terminal;
    a first flip-flop having a data input terminal coupled to the output terminal of the first logic, and further having a data output terminal coupled to the internal node;

second logic having input terminals coupled to the first and second input terminals of the control circuit, and further having an output terminal;
a second flip-flop having a data input terminal coupled to the output terminal of the second logic, and further having a data output terminal coupled to the read enable output terminal of the control circuit;
third logic having input terminals coupled to the first input terminal of the control circuit, the second input terminal of the control circuit, the read enable output terminal of the control circuit, and the internal node, the third logic having an output terminal; and
a third flip-flop having a data input terminal coupled to the output terminal of the third logic, and further having a data output terminal coupled to the write enable output terminal of the control circuit;
wherein each of the first, second, and third flip-flops comprises a clock input terminal coupled to the local clock input terminal of the control circuit.

5. The concatenated FIFO of claim 1, wherein the second FIFO comprises a FIFO operating in first-word-fall-through (FWFT) mode.

6. A programmable integrated circuit (IC) programmed to implement a first-in-first-out memory circuit (FIFO), comprising:
a first block RAM programmed to implement a first FIFO having a plurality of data input terminals, a plurality of data output terminals, a write clock input terminal, and a read clock input terminal;
a second block RAM programmed to implement a second FIFO having a plurality of data input terminals, a plurality of data output terminals, a write clock input terminal, and a read clock input terminal;
a control circuit having a local clock input terminal;
a plurality of data signal paths implemented between the data output terminals of the first FIFO and the data input terminals of the second FIFO;
a first plurality of signal paths implemented between the first block RAM and the control circuit;
wherein the first plurality of signal paths includes:
a first status signal path implemented between a status output terminal of the first FIFO and a first input terminal of the control circuit; and
a read enable signal path implemented between a read enable output terminal of the control circuit and a read enable input terminal of the first FIFO;
a second plurality of signal paths implemented between the second block RAM and the control circuit;
wherein the second plurality of signal paths includes:
a second status signal path implemented between a status output terminal of the second FIFO and a second input terminal of the control circuit; and
a write enable signal path implemented between a write enable output terminal of the control circuit and a write enable input terminal of the second FIFO;
a local clock signal path implemented between the read clock input terminal of the first FIFO, the write clock input terminal of the second FIFO, and the local clock input terminal of the control circuit; and
wherein the control circuit includes:
first logic having input terminals coupled to the first input terminal of the control circuit, the second input terminal of the control circuit, the read enable output terminal of the control circuit, and an internal node, the first logic having an output terminal;
a first flip-flop having a data input terminal coupled to the output terminal of the first logic, and further having a data output terminal coupled to the internal node;
second logic having input terminals coupled to the first and second input terminals of the control circuit, and further having an output terminal;
a second flip-flop having a data input terminal coupled to the output terminal of the second logic, and further having a data output terminal coupled to the read enable output terminal of the control circuit;
third logic having input terminals coupled to the first input terminal of the control circuit, the second input terminal of the control circuit, the read enable output terminal of the control circuit, and the internal node, the third logic having an output terminal; and
a third flip-flop having a data input terminal coupled to the output terminal of the third logic, and further having a data output terminal coupled to the write enable output terminal of the control circuit;
wherein each of the first, second, and third flip-flops comprises a clock input terminal coupled to the local clock signal path.

7. The programmable IC of claim 6, wherein the first plurality of signal paths and the second plurality of signal paths each comprise at least a portion of a programmable interconnect structure of the programmable IC.

8. The programmable IC of claim 6, wherein the local clock signal path comprises at least a portion of a clock distribution network of the programmable IC.

9. The programmable IC of claim 6, wherein at least one of the first and second FIFOs comprises a dedicated block RAM in the programmable IC.

10. The programmable IC of claim 6, wherein the local clock signal path is coupled to the write clock input terminal of the first FIFO.

11. The programmable IC of claim 6, wherein the local clock signal path is coupled to the read clock input terminal of the second FIFO.

12. The programmable IC of claim 6, wherein the second block RAM is programmed to implement a FIFO operating in first-word-fall-through (FWFT) mode.

* * * * *